United States Patent
Chian et al.

(10) Patent No.: US 8,300,381 B2
(45) Date of Patent: *Oct. 30, 2012

(54) LOW COST HIGH SPEED SPARK VOLTAGE AND FLAME DRIVE SIGNAL GENERATOR

(75) Inventors: Brent Chian, Plymouth, MN (US); Jonathan McDonald, Bloomington, MN (US); Norm Planer, Annandale, MN (US)

(73) Assignee: Honeywell International Inc., Morristwon, NJ (US)

(*) Notice: Subject to any disclaimer, the term of this patent is extended or adjusted under 35 U.S.C. 154(b) by 934 days.

This patent is subject to a terminal disclaimer.

(21) Appl. No.: 12/368,830

(22) Filed: Feb. 10, 2009

(65) Prior Publication Data

US 2009/0136883 A1   May 28, 2009

Related U.S. Application Data

(63) Continuation-in-part of application No. 11/773,198, filed on Jul. 3, 2007, now Pat. No. 8,085,521.

(51) Int. Cl.
*F23Q 3/00* (2006.01)
(52) U.S. Cl. ...................................................... 361/253
(58) Field of Classification Search .................. 361/253
See application file for complete search history.

(56) References Cited

U.S. PATENT DOCUMENTS

| | | |
|---|---|---|
| 3,425,780 A | 2/1969 | Potts |
| 3,520,645 A | 7/1970 | Cotton et al. |
| 3,649,156 A | 3/1972 | Conner |
| 3,681,001 A | 8/1972 | Potts |
| 3,836,857 A | 9/1974 | Ikegami et al. |
| 3,909,816 A | 9/1975 | Teeters |
| 4,157,506 A | 6/1979 | Spencer |
| 4,221,557 A | 9/1980 | Jalics |
| 4,242,079 A | 12/1980 | Matthews |
| 4,269,589 A | 5/1981 | Matthews |
| 4,280,184 A | 7/1981 | Weiner et al. |
| 4,303,385 A | 12/1981 | Rudich, Jr. et al. |
| 4,370,557 A | 1/1983 | Axmark et al. |
| 4,450,499 A | 5/1984 | Sorelle |
| 4,457,692 A | 7/1984 | Erdman |
| 4,483,672 A | 11/1984 | Wallace et al. |
| 4,521,825 A | 6/1985 | Crawford |
| 4,527,247 A | 7/1985 | Kaiser et al. |
| 4,555,800 A | 11/1985 | Nishikawa et al. |

(Continued)

FOREIGN PATENT DOCUMENTS

EP   0967440   12/1999

(Continued)

OTHER PUBLICATIONS www.playhookey.com, "Series LC Circuits," 5 pages, printed Jun. 15, 2007.

(Continued)

*Primary Examiner* — Stephen W Jackson
(74) *Attorney, Agent, or Firm* — Seager Tufte & Wickhem LLC.

(57) ABSTRACT

A system for generating a high DC voltage for a spark to ignite a flame in a combustion device, and a high AC voltage for a flame rod to sense a flame in the device, from a low voltage for combustion device control. The system may be an inexpensive mechanism.

20 Claims, 7 Drawing Sheets

U.S. PATENT DOCUMENTS

| | | | |
|---|---|---|---|
| 4,622,005 A * | 11/1986 | Kuroda | 431/78 |
| 4,655,705 A | 4/1987 | Shute et al. | |
| 4,672,324 A | 6/1987 | van Kampen | |
| 4,695,246 A | 9/1987 | Beilfuss et al. | |
| 4,709,155 A | 11/1987 | Yamaguchi et al. | |
| 4,777,607 A | 10/1988 | Maury et al. | |
| 4,830,601 A | 5/1989 | Dahlander et al. | |
| 4,842,510 A | 6/1989 | Grunden et al. | |
| 4,843,084 A | 6/1989 | Parker et al. | |
| 4,872,828 A | 10/1989 | Mierzwinski | |
| 4,904,986 A | 2/1990 | Pinckaers | |
| 4,949,355 A | 8/1990 | Dyke et al. | |
| 4,955,806 A | 9/1990 | Grunden et al. | |
| 5,026,270 A | 6/1991 | Adams et al. | |
| 5,026,272 A | 6/1991 | Takahashi et al. | |
| 5,037,291 A | 8/1991 | Clark | |
| 5,073,769 A | 12/1991 | Kompelien | |
| 5,077,550 A | 12/1991 | Cormier | |
| 5,112,217 A | 5/1992 | Ripka et al. | |
| 5,126,721 A | 6/1992 | Butcher et al. | |
| 5,158,447 A | 10/1992 | Geary | |
| 5,175,439 A | 12/1992 | Harer et al. | |
| 5,222,888 A | 6/1993 | Jones et al. | |
| 5,236,328 A | 8/1993 | Tate et al. | |
| 5,255,179 A | 10/1993 | Zekan et al. | |
| 5,276,630 A | 1/1994 | Baldwin et al. | |
| 5,280,802 A | 1/1994 | Comuzie, Jr. | |
| 5,300,836 A | 4/1994 | Cha | |
| 5,347,982 A | 9/1994 | Binzer et al. | |
| 5,365,223 A | 11/1994 | Sigafus | |
| 5,391,074 A | 2/1995 | Meeker | |
| 5,424,554 A | 6/1995 | Marran et al. | |
| 5,446,677 A | 8/1995 | Jensen et al. | |
| 5,472,336 A | 12/1995 | Adams et al. | |
| 5,506,569 A | 4/1996 | Rowlette | |
| 5,567,143 A | 10/1996 | Servidio | |
| 5,599,180 A | 2/1997 | Peters et al. | |
| 5,682,329 A | 10/1997 | Seem et al. | |
| 5,722,823 A | 3/1998 | Hodgkiss | |
| 5,797,358 A | 8/1998 | Brandt et al. | |
| 5,971,745 A | 10/1999 | Bassett et al. | |
| 6,060,719 A | 5/2000 | DiTucci et al. | |
| 6,071,114 A | 6/2000 | Cusack et al. | |
| 6,084,518 A | 7/2000 | Jamieson | |
| 6,222,719 B1 | 4/2001 | Kadah | |
| 6,261,086 B1 | 7/2001 | Fu | |
| 6,299,433 B1 | 10/2001 | Gauba et al. | |
| 6,346,712 B1 | 2/2002 | Popovic et al. | |
| 6,349,156 B1 | 2/2002 | O'Brien et al. | |
| 6,356,827 B1 | 3/2002 | Davis et al. | |
| 6,385,510 B1 | 5/2002 | Hoog et al. | |
| 6,457,692 B1 | 10/2002 | Gohl, Jr. | |
| 6,474,979 B1 | 11/2002 | Rippelmeyer | |
| 6,486,486 B1 | 11/2002 | Haupenthal | |
| 6,509,838 B1 | 1/2003 | Payne et al. | |
| 6,552,865 B2 | 4/2003 | Cyrusian | |
| 6,676,404 B2 | 1/2004 | Lochschmied | |
| 6,743,010 B2 | 6/2004 | Bridgeman et al. | |
| 6,782,345 B1 | 8/2004 | Siegel et al. | |
| 6,794,771 B2 | 9/2004 | Orloff | |
| 6,912,671 B2 | 6/2005 | Christensen et al. | |
| 6,917,888 B2 | 7/2005 | Logvinov et al. | |
| 7,088,137 B2 | 8/2006 | Behrendt et al. | |
| 7,088,253 B2 | 8/2006 | Grow | |
| 7,202,794 B2 | 4/2007 | Huseynov et al. | |
| 7,241,135 B2 | 7/2007 | Munsterhuis et al. | |
| 7,255,285 B2 | 8/2007 | Troost et al. | |
| 7,274,973 B2 | 9/2007 | Nichols et al. | |
| 7,289,032 B2 | 10/2007 | Seguin et al. | |
| 7,327,269 B2 | 2/2008 | Kiarostami | |
| 7,617,691 B2 | 11/2009 | Street et al. | |
| 7,728,736 B2 | 6/2010 | Leeland et al. | |
| 7,764,182 B2 | 7/2010 | Chian et al. | |
| 7,768,410 B2 | 8/2010 | Chian | |
| 7,800,508 B2 | 9/2010 | Chian et al. | |
| 8,085,521 B2 * | 12/2011 | Chian | 361/253 |
| 2002/0099474 A1 | 7/2002 | Khesin | |
| 2003/0064335 A1 | 4/2003 | Canon | |
| 2003/0222982 A1 | 12/2003 | Hamdan et al. | |
| 2004/0209209 A1 | 10/2004 | Chodacki et al. | |
| 2005/0086341 A1 | 4/2005 | Enga et al. | |
| 2006/0257805 A1 | 11/2006 | Nordberg et al. | |
| 2007/0159978 A1 | 7/2007 | Anglin et al. | |
| 2007/0188971 A1 | 8/2007 | Chian et al. | |
| 2009/0009344 A1 | 1/2009 | Chian | |
| 2010/0013644 A1 | 1/2010 | McDonald et al. | |
| 2010/0265075 A1 | 10/2010 | Chian | |

FOREIGN PATENT DOCUMENTS

| | | |
|---|---|---|
| EP | 1148298 | 10/2001 |
| WO | 9718417 | 5/1997 |

OTHER PUBLICATIONS

Honeywell, "S4965 SERIES Combined Valve and Boiler Control Systems," 16 pages, prior to the filing date of present application.

Honeywell, "SV9410/SV9420; SV9510/SV9520; SV9610/SV9620 SmartValve System Controls," Installation Instructions, 16 pages, 2003.

* cited by examiner ated with 24 VAC. Voltage 14 may be in the range of 20 to 40 volts. When FlameDrivePWM 15 is at a resonant frequency of the LC circuit 16 containing an inductor 17 and capacitor 18, a high voltage near sinusoidal waveform may be generated as an output 57 at the common node of inductor 17 and capacitor 18. The common node or output of circuit 16 may be also regarded as an output terminal 57. Inductor 17 may have value of about 18 millihenries and capacitor 18 may have a value of about 10 nanofarads. A duty cycle of FlameDrivePWM 15 may be changed with pulse width modulation to control the amplitude of the near sinusoidal waveform. The waveform may be sent to ToFlameRod terminal 19 connected via a D.C. blocking capacitor 36 and current limiting resistor 37 to a flame rod 44 for flame sensing. Terminal 19 may also be connected to a compensation circuit 20, 30. Capacitor 36 may have a value of about 2,200 picofarads. Resistor 37 may have a value of about 100 K-ohms.

LOW COST HIGH SPEED SPARK VOLTAGE AND FLAME DRIVE SIGNAL GENERATOR

The present application is a continuation-in-part of U.S. patent application Ser. No. 11/773,198, filed Jul. 3, 2007. U.S. patent application Ser. No. 11/773,198, filed Jul. 3, 2007, is hereby incorporated by reference.

BACKGROUND

The present invention pertains to combustion systems and particularly to heating systems. More particularly, the invention pertains to ignition and sensing in heating systems.

SUMMARY

The invention is a low cost generator for a combustion system that uses low voltage of a combustion control mechanism to generate a high voltage DC for spark ignition and high voltage AC for flame sensing. The generator may also have a circuit for compensating of a loading effect on a flame sensing network.

DESCRIPTION

Many gas combustion controls use 24 volts AC as a power source. The control may need to generate a high voltage for a spark to ignite a combustible for a flame, and also to generate a high voltage AC signal to sense the flame.

Some related art may use a DCDC converter to boost the low DC voltage to a higher level for spark, and then use a switching circuit to convert the high level DC voltage into an AC signal for flame sensing. This approach may require several high voltage parts and be relatively expensive.

The present circuit uses low voltage parts and an inductive-capacitive (LC) resonant circuit 16 to generate the AC high voltage for flame sensing. The AC voltage may be rectified to generate the spark voltage. A controller may actively control the frequency and duty cycle of a drive signal to control the AC voltage amplitude and the spark voltage charging up speed to meet the spark and flame timing requirements.

Figure 1:
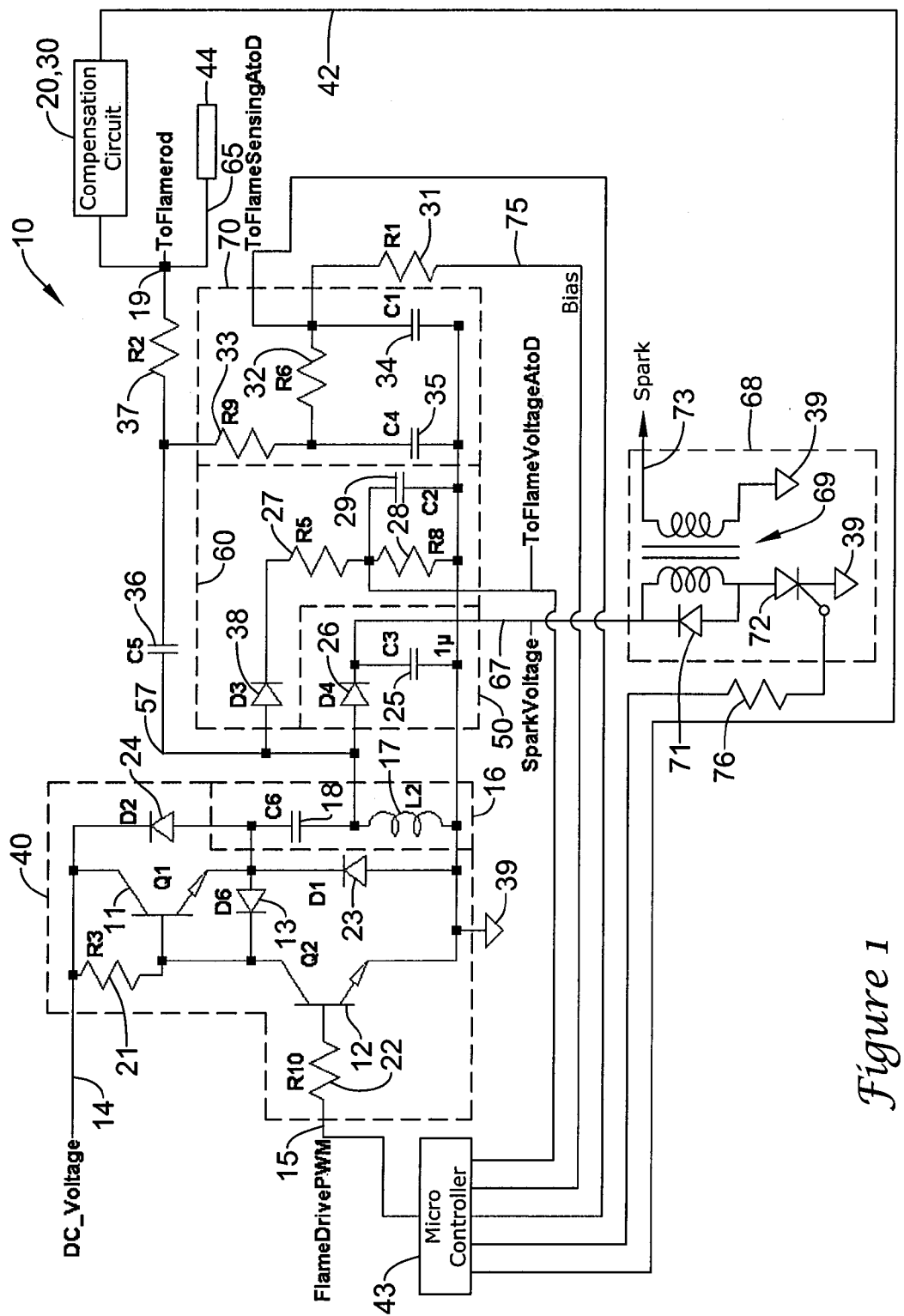
FIG. 1 is a diagram of a spark voltage and flame signal generation circuit.

FIG. 1 is a diagram of a spark and flame signal generation circuit 10. Transistors 11 and 12 and diode 13 form a push-pull drive. DC_voltage 14 relative to a reference terminal or ground 39 may be rectified 24 VAC. Voltage 14 may be in the range of 20 to 40 volts. When FlameDrivePWM 15 is at a resonant frequency of the LC circuit 16 containing an induc- A high level voltage does not necessarily exist anywhere in the drive circuit 40 (a 1.5 K-ohm resistor 21, a 2 K-ohm resistor 22, diode 23, diode 24, diode 13, transistor 11 and transistor 12). So these components may be implemented for low voltage application and have low cost.

Diode 23 and diode 24 may be added to provide current path when the resonant current of the LC network 16 is not in perfect synchronization with the drive signal. To generate a spark voltage on capacitor 25 quickly, the drive may need to be rather strong, and diode 23 and diode 24 may be added to improve the network efficiency and reduce the heat generated on the drive components.

A spark voltage circuit 50 may include components 25 and 26. Diode 26 may rectify the AC output voltage from circuit 16 so as to charge up a capacitor 25. Capacitor 25 may be charged up to a high voltage level for spark generation. Typically, capacitor 25 may be 1 microfarad and be charged up to about 170 volts or so for each spark.

An output 67 of circuit 50 may go to a spark circuit 68. Output 67 may be connected to a first end of a primary winding of a transformer 69 and to a cathode of a diode 71. An anode of diode 71 may be connected to a second end of the primary winding. The second end of the primary winding may be connected to an anode of an SCR 72. A cathode of SCR 72 may be connected to a reference voltage or ground 39. A gate of SCR 72 may be connected to controller 43 through a 1 K-ohm resistor 76. A first end of a secondary winding of transformer 69 may be connected to a spark terminal 73. A second end of transformer 69 may be connected to ground or reference voltage 39.

When capacitor 25 is charged up, a signal from controller 43 may go to the gate of SCR 72 to turn on the SCR and discharge capacitor 25 to ground or reference voltage 39 resulting in a high surge of current through the primary winding of transformer 69 to cause a high voltage to be across the secondary winding to provide a spark between terminal 73 and ground or reference voltage 39.

A diode 38, a 470 K-ohm resistor 27, a 35.7 K-ohm resistor 28 and a 0.1 microfarad capacitor 29 may form a circuit 60 for sensing flame voltage from output 57 of LC circuit 16. Circuit 60 may provide an output signal, from the common connection of resistors 27 and 28 to microcontroller 43, indicating the voltage amplitude of the drive signal to flame rod 44.

A 200 K-ohm resistor 32, a 200 K-ohm resistor 33, a 0.01 microfarad capacitor 34 and a 0.01 microfarad capacitor 35 may form a circuit 70 having an output at the common connection of resistor 32 and capacitor 34 for flame sensing which goes to controller 43. At least a portion of circuit 70 may incorporate a ripple filter for filtering out the AC component of the flame rod drive signal so as to expose the DC offset current of flame rod 44. The DC offset current may be indicated at the output of circuit 70. When a flame is present, flame rod 44 may have a corresponding DC offset current. A resistor connected in series with a diode having its cathode connected to ground may be an equivalent circuit of flame rod 44 sensing a flame. When no flame is present, flame rod 44 may have no or little DC offset current. Resistor 31 may be a bias element. Microcontroller 43 may provide a bias 75 input (e.g., about 4.5 volts) to circuit 70 via a 200 K-ohm resistor 31. As the flame current is flowing from flame rod 44 out to the flame, generating a negative voltage at capacitor 34, a positive bias 75 is necessary to pull the voltage at capacitor 34 above ground or reference voltage 39 for microcontroller 43 to measure the flame.

At first power up, a microcontroller 43 may drive a FlameDrivePWM signal at an input 15 with a nearly square waveform shape. The frequency of the FlameDrivePWM signal at terminal 15 may be varied and the flame voltage at line 57 be monitored to find the resonant frequency of the LC network 16. After that, the drive is generally kept at this frequency, and the duty cycle may be changed so that capacitor 25 can be charged to the required level within the predetermined time interval. This duty cycle may be stored as SparkDuty. The duty cycle may be changed again to find a duty cycle value at which the flame sensing signal is at the desired level, for example, 180 volts peak. This duty cycle value may be saved as FlameDuty. The frequency of the PWM signal 15 may be changed to fine tune the signal amplitude at the output of LC network 16.

Note that if the DC_Voltage 14 changes, the duties may need adjustment. This adjustment may be done continuously and slowly at run time. At spark time, the FlameDrivePWM signal may stay at the SparkDuty value and the spark voltage be monitored. The SparkDuty value may be adjusted as necessary during spark time.

At flame sensing time, capacitor 25 is to be overcharged some 10 to 20 volts higher than the flame voltage, so that capacitor 25 will not present itself as a burden or heavy load on the LC network 16 and thus the flame voltage at line 57 can be varied quickly.

The flame sensing circuit 70 may support a high flame sensing rate, such as 60 samples per second. Sixty samples/second may be limited by the fact that the drive and flame signal itself carries a line frequency component, not limited by the circuit.

Compensating circuits 20 and 30 may be added for high frequency flame sense loading. When sensing very low current levels (micro-amps) from flame rectification in an ignition system, accuracy is very important. Using a high frequency circuit to generate the high voltages needed for proper flame rectification, capacitive coupling 66 effects from the appliance wiring 65 can substantially reduce the sensed current levels. Capacitive coupling 66 to reference 39 may be about 30 picofarads or greater. The appliance wiring 65 may be a cable or connection mechanism from the sensing control circuit to the flame rod 44. The added circuit 20, 30 is intended to compensate for the load 66 presented by the appliance wiring 65 to provide more accurate current sense capabilities. Circuit 20, 30 may provide a high impedance input relative to the flame rod 44 at line 19 and a low impedance output to the A/D of microcontroller 43. The frequency output of the LC network 16 may be about 12 KHz, resistor 37 of about 100 K-ohms may be used to limit the current for safety, and a capacitor 36 may be used to block DC from the flame rod voltage generating LC circuit 16. With these conditions, appliance wiring 65 in typical installations can reduce the current sense level by up to 30 percent. In some applications where longer wiring is needed, the current sense signal may be reduced even more resulting in a sensing error greater than 30 percent. Adding the present compensation circuit 20, 30 can reduce the signal sensing error down to within 5 to 10 percent of the original signal.

The present approach may solve the issue of a reduced signal by adding a sensing or compensation network at the flame sense terminal 19 which compares that voltage with the voltage generated by the control circuit 57. If the output voltage has been reduced, then either the generated voltage may be increased or microcontroller software can compensate for the loading effect. In order for the present approach to be accurate, the software may perform an initial calibration of the circuit without any load on the flame sense terminal 19. The maximum allowable load can be used as well to establish an acceptable range of values.

The sensing or compensation network 20, 30 may be added at the flame sense terminal 19. The network or circuit 20, 30 should present very little load to the flame sensing signal so that the flame signal is not reduced or otherwise affected by the sensing circuit 20, 30.

Figure 2:
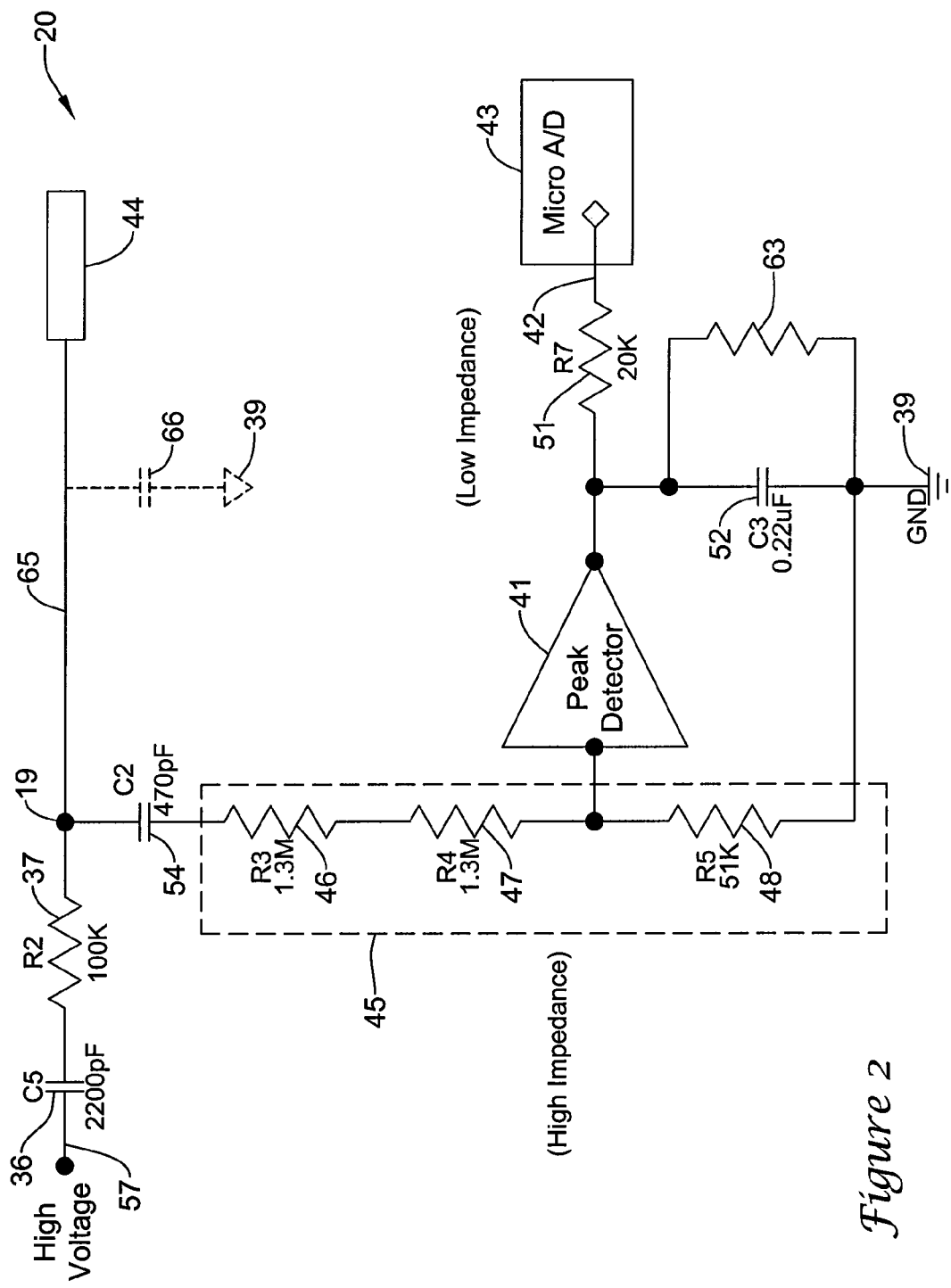
FIGS. 2 and 3 are examples of a sensing compensation circuit.

A sensing compensation circuit 20 is shown in FIG. 2. A peak detector 41 with high input impedance and low output impedance may be used. An output 42 of circuit 20 may be fed to an A/D converter on a microcontroller 43. A resistor network 45, having resistors 46, 47 and 48 connected in series with the common connection of resistors 47 and 48 connected at an input of the peak detector 41, may scale the flame drive signal at the sense terminal 19 down to a level that the A/D converter of controller 43 can handle. Terminal 19 may be connected to a 470 picofarad capacitor 54 with the other end of the capacitor 54 connected to the input end of network 45 at resistor 46.

Resistors 46 and 47 may have values of about 1.3 M-ohms. Resistor 48 may be about 51 K-ohms. The end of resistor 48 opposite of the end connected to peak detector 41 may be connected to a ground or reference voltage terminal 39. Between the output of peak detector 41 and A/D converter at controller 43 may be a 20 K-ohm resistor 51. A line or conductor, being regarded as the output 42 of circuit 20, may connect resistor 51 to controller 43. A signal representing rod 44 voltage or DC offset current may be indicated on line 42.

The peak detector 41 output may also be connected to terminal 39 with a 0.22 microfarad capacitor 52. Resistor 63 is in parallel with capacitor 52 to discharge capacitor 52 so that the circuit output can track the voltage when it decreases. Other resistor and capacitor values may be used. The values shown are for illustrative purposes. Other circuit configurations may be implemented.

Figure 3:
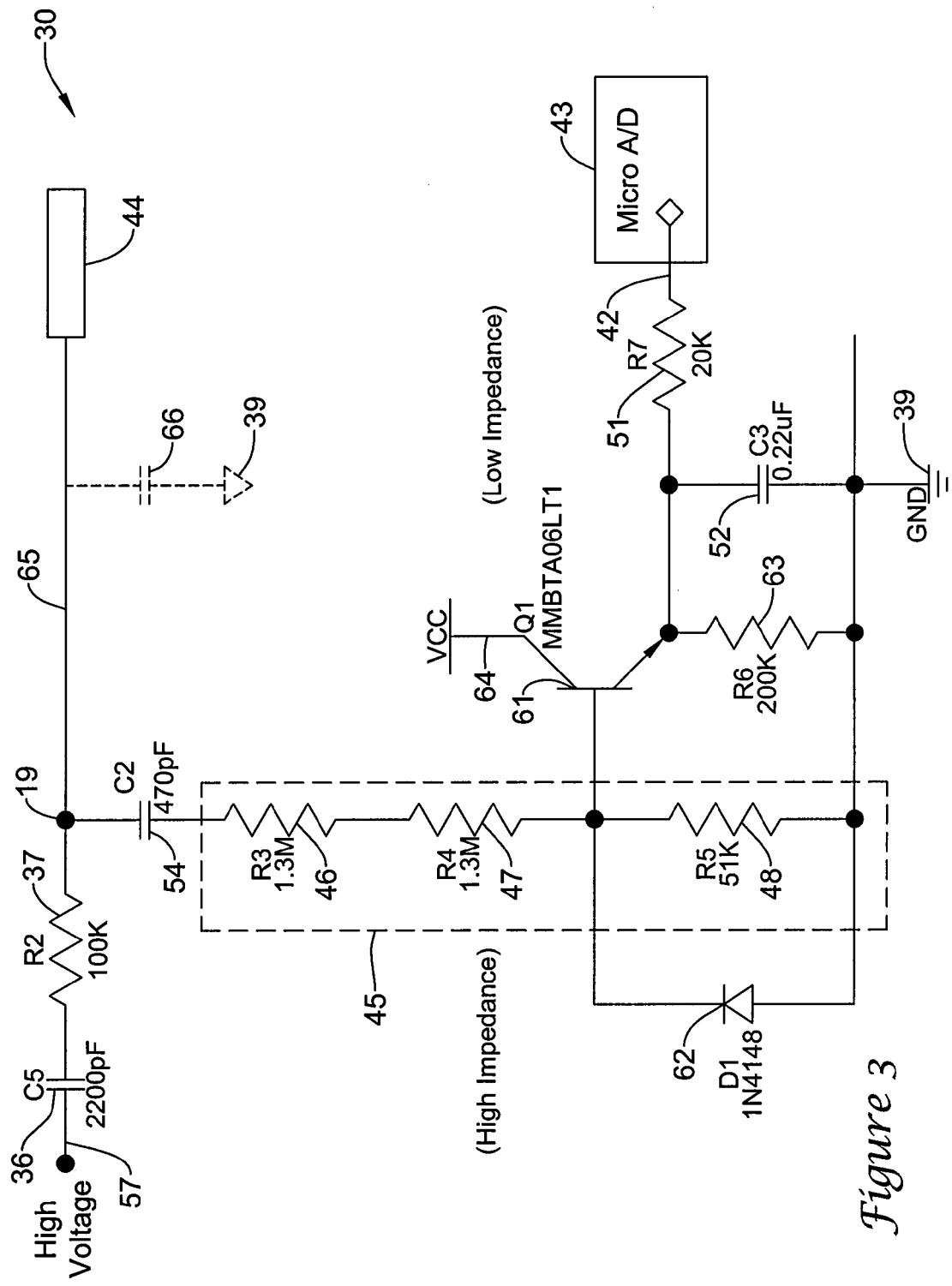

Alternately, in lieu of circuit 20, a low-cost sample and hold sensing compensation circuit 30 shown in FIG. 3 may be built as a transistor hardware implementation with discrete components. A NPN transistor 61 may be used to replace an active sample and hold IC. Transistor 61 may be an MMBTA06LT1 model but other types of transistors with accommodating circuitry may be used. A voltage drop (i.e., about 0.6 volt) on the base-emitter (BE) junction of the transistor 61 may be corrected by microcontroller 43 software. The output at the emitter of transistor 61 may be about 5.0 volts or lower. A diode 62 may be added to limit the negative voltage level on the base of the transistor 61 so that the reverse bias on the BE junction of transistor 61 does not exceed a harmful level. Diode 62 may be a 1N4148 model. The diode may be connected with its cathode to the transistor base and anode to terminal 39. However, diode 62 may be omitted as the reverse current of the BE junction may be generally limited with the associated circuitry, and thus transistor 61 should not be damaged. However, if a BE junction breakdown occurs, circuit performance may be reduced. The layout of circuit 30 is similar to that of circuit 20 except that the peak detector 41 is effectively replaced by transistor 61. The base of the transistor 61 may be connected in lieu of the peak detector 41 input. The emitter of transistor 61 may be connected in lieu of the output of the peak detector. The remaining components and connections of circuit 30 may be the same as those of circuit 20, except for transistor 61 and the optional diode 62 across the BE junction of transistor 61. The collector of transistor 61 may be connected to a VCC voltage supply terminal 64.

Microcontroller 43 may calibrate an A/D reading based on an initial "open circuit" reading without anything connected to the flame sense terminal 19. Microcontroller 43 will then use that value to compare against and adjust the flame current readings as needed.

Figure 4:
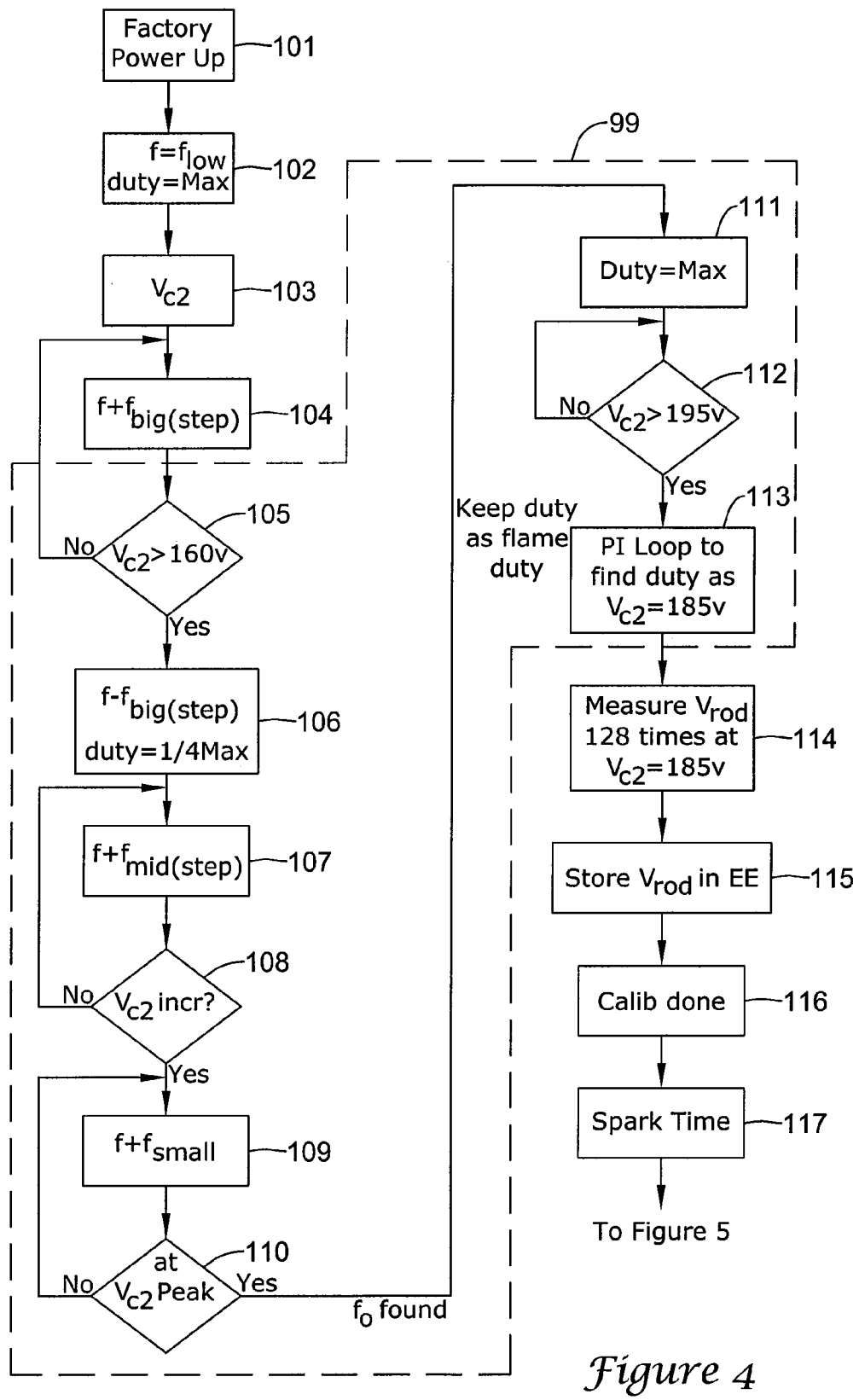
FIGS. 4 and 5 constitute a flow diagram of an example operation or process of the present generation system.
Figure 5:
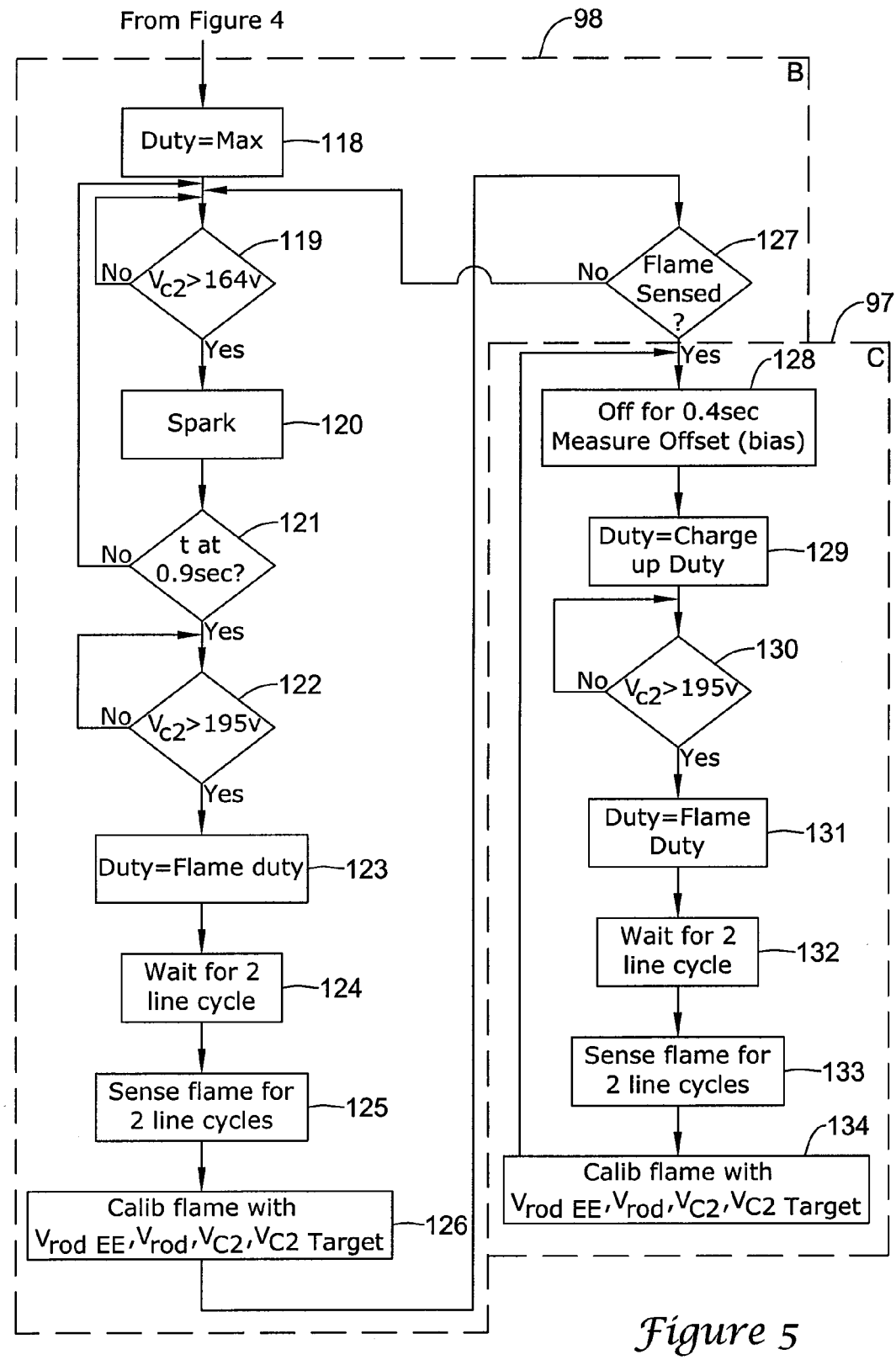

FIGS. 4 and 5 constitute a flow diagram of an example operation or process of the present system 10, which may be provided by controller 43. Block 101 indicates a factory power-up of the system. The frequency f of the LC circuit 16 output may equal fLOW (f=fLOW) and the duty cycle of the PWM signal driving circuit 16 may be at a maximum (duty=max) as shown in block 102. The voltage of output 57 of circuit 16 may be monitored at capacitor 29 (VC2) of peak voltage sensing circuit 60 as indicated in block 103. The voltage indication at block 103 may be provided to a block 104 where f+fbig step is indicated for providing an increase of frequency to increase the voltage VC2 in block 103. A resultant voltage VC2 may go to a symbol 105 to determine whether VC2 is greater than a certain voltage goal such as 160 volts. If not, then the process may return to block 104 for another fbig step increase. This loop may continue until VC2 exceeds 160 volts. If VC2 exceeds 160 volts, then the process may go on to a block 106 where a step back can be taken with f−fbig step having a duty cycle at ¼ max. Using the much lower duty keeps VC2 lower than the voltage on capacitor 25, so that large capacitor 25 will not present a heavy load and slow down the response of the LC network when the frequency or duty change. Then a resulting output may go from block 106 to a block 107 where the voltage VC2 may be increased with an f+fmid step. Then at symbol 108, voltage VC2 may be checked for an increase. If there is an increase, it means that the resonate frequency is not reached yet. Then the process may return to block 107 for another f+fmid step. Again a check for a VC2 increase may be checked at symbol 108. This loop may continue until there is a decrease in VC2, indicating that the current frequency is higher than the resonate frequency of the network of LC. The process continues at block 109 where VC2 can be increased or decreased according to f+/−fsmall step. A result of 109 may go to a symbol 110 where VC2 is checked to see if it has reached a peak magnitude. If not, then the process may return to block for f+fsmall step or f−fsmall step to seek a peak of VC2 which may again be checked at symbol 110. This loop may continue until the peak of VC2 is found. When found, then the resonant frequency f0 of LC circuit 16 may be found. Then the process may continue at block 111 where the duty cycle is set at a maximum (duty=max). The process may continue to a symbol 112 where VC2 is checked to see if it exceeds another voltage higher than the peak of VC2 used for finding f0. For instance, a voltage of 195 volts may be selected. So if VC2 does not exceed 195 volts, then a loop back to the entry of symbol 112 may occur. The loop may continue until VC2 exceeds 195 volts. Upon reaching that magnitude, then the process may continue at block 113 with a PI loop designed to find the duty cycle so that VC2 equals 185 volts. The duty cycle may be saved as "flame duty". Symbol 105 through block 113 may be regarded as a normal cycle as indicated by a dashed enclosure 99.

An output from block 113 may go to a block 114 where the rod voltage (VROD) is measured 128 times at VC2=185 volts. The measured VROD may be stored in a flash/electronically erasable (EE) memory in block 115. At block 116 a calibration may be done.

The process may continue at block 117. Spark time may be indicated at block 117. The duty cycle may be indicated to be at a maximum (duty=max) at block 118. From block 118, the process may continue at symbol 119 to note whether VC2 is greater than 164 volts. If not, then a loop back to the entry of block 119 may occur and VC2 may be measured again at symbol 119. This loop may continue until VC2 exceeds 164 volts (VC2>164 v), when an output of symbol 119 goes to a block 120 for a spark. At symbol 121, a time measure may be taken and determined whether it is 0.9 second (t at 0.9 sec?). If not, then a loop back to the entry point of symbol 119 may be made. The process may again proceed through symbol 119, block 120 and symbol 121. This loop may continue until the time measured at symbol 121 is at 0.9 second. Once the time is at 0.9 seconds, the process may proceed to symbol 122 where it may be determined whether VC2 is greater than 195 volts (VC2>195 v). If not, a loop back to the entry of symbol 122 may be made. This loop may continue until VC2 exceeds 195 volts. When VC2 exceeds this voltage, then the process may continue at block 123 where the duty cycle is equal to the flame duty cycle (duty=flame duty). Then the process may continue at block 124 where a wait for two line cycles occurs (wait for 2 line cycle). Once the cycle occurs, the flame may be sensed for two line cycles at block 125. The process may continue to a block 126 where the flame sensed result may be calibrated with VROD EE, VROD, VC2 and VC2 Target. From block 126, an output may go to a symbol 127 which checks whether the flame was sensed. If not, the process may loop back to the entry of symbol 119 and continue through the blocks and symbols, as noted herein, through symbol 127. This loop may continue until symbol 127 indicates that the flame has been sensed. Blocks and symbols 118 through 127 may be regarded as a spark and flame generation group 98.

If a flame is sensed, then an output from symbol 127 may go to a block 128 where the spark and flame generation is off for 0.4 second and the offset (bias) is measured. After block 128, the duty cycle may be set to the charge-up duty at block 129 (duty=charge-up duty). From block 129, the process may continue at symbol 130 where VC2 is checked to note whether it is greater than 195 volts (VC2>195 v). If VC2 is not greater than 195 volts, then the process may loop back to the entry of symbol 130 and VC2 may be measured again. Once VC2 exceeds 195 volts, then the process may proceed to a block 131 where the duty cycle is set to the flame duty (duty=flame duty). After block 131, the process may continue to a block 132 where there may be a wait for a two line cycle. Upon completion of the wait, then the flame may be sensed for two line cycles in block 133. After the flame sensing, the flame voltage may be calibrated with VROD EE, VROD, VC2 and VC2 Target, at block 134. Blocks 132, 133 and 134 may resemble blocks 124, 125 and 126, respectively. After block 134, the process may loop back to the entry of block 128 and sequence through the blocks and symbol 128-134 again. These blocks and symbol may be regarded as a group 97. This loop may continue indefinitely until system is stopped. The voltages, frequencies, duty cycles, frequency steps, times, sense cycles, and so forth, are illustrative examples and may be other items or have other characteristics, values and the like other than those indicated in FIGS. 4 and 5.

Figure 6:
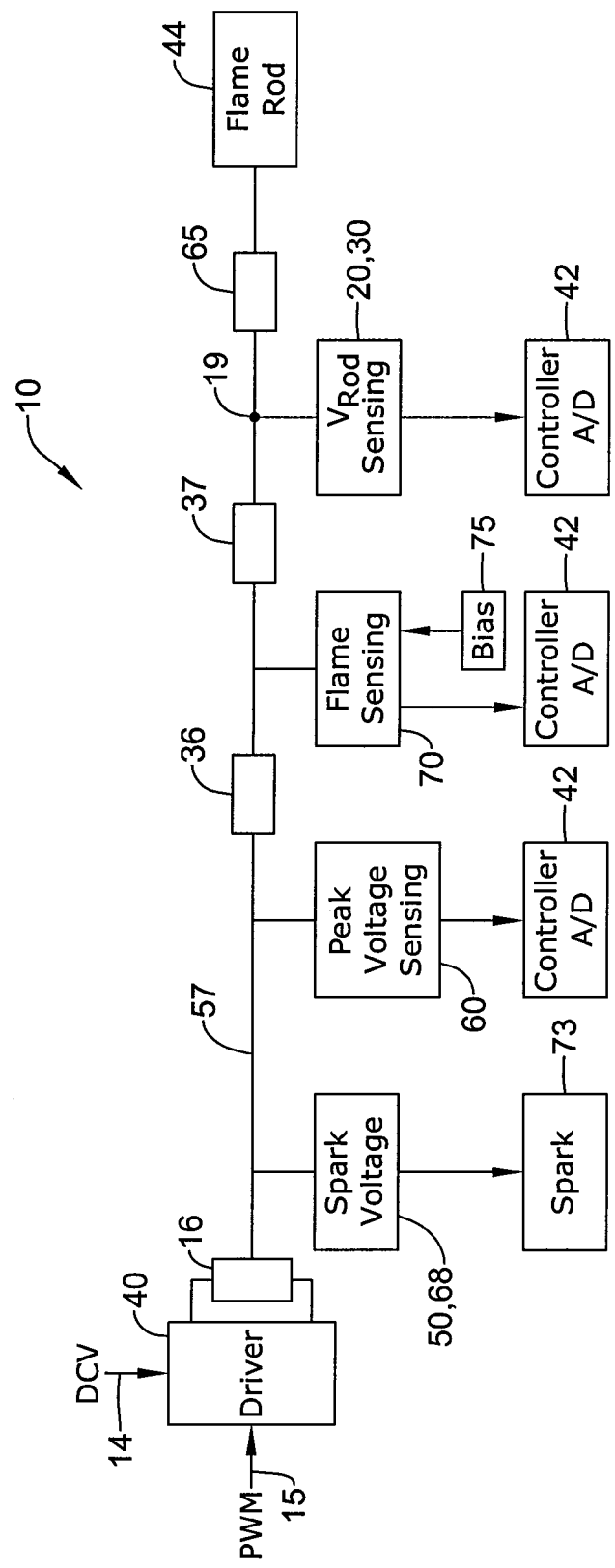
FIG. 6 is a diagram of the basic structure of the spark voltage and flame rod voltage generator.

FIG. 6 is a diagram of the basic structure of the spark voltage and flame rod voltage generator 10. A driver block 40 may have a low DC voltage input 14 and a pulse width modulation (PWM) signal 15. An output of driver 40 may go to an inductor-capacitor circuit or block 16 having a resonant frequency. The signal from driver 40 may have a frequency close to the resonant frequency of block 16. An output 57 of circuit 16 may go to a spark voltage block circuit 50, 68, peak voltage sensing block 60, and a direct current blocker 36. An output of spark voltage block may go a spark block 73. An output from the peak voltage sensing block 60 may go to an A/D in controller 43. From blocker 36, an output may go to a flame sensing block 70 and a current limiter 37. An output from flame sensing block 70 may go to an A/D in controller 42. A bias block 75 may provide a voltage to the flame sensing block 70. From current limiter 37, an output signal on terminal 19 may go to a rod voltage sensing or compensating block 20, 30. An output of block 20, 30 may go to an A/D in controller 42. A signal of terminal 19 may go to a flame rod block 44 via a conveyance block 65. Sensing or compensating block 20, 30 may provide compensation relative to signal deficiencies due to conveyance block 65.

Figure 7:
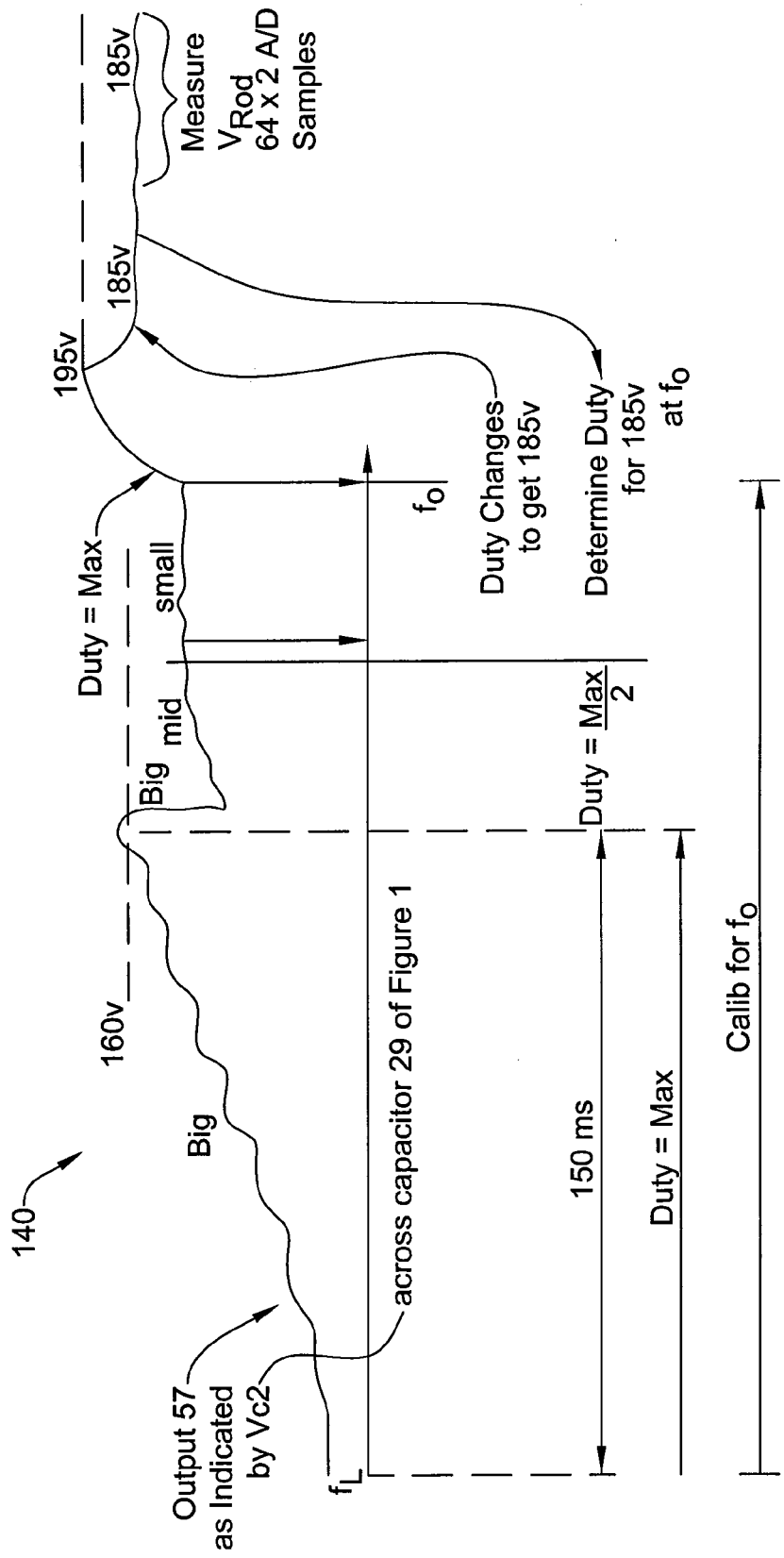
FIG. 7 is a graph of a monitored voltage from a resonant circuit in terms of the system starting up for operation.

FIG. 7 is a graph 140 of VC2 in terms of the system starting up for operation. Much of graph 140 resembles a process in items 102-114 in FIG. 4. One may start out with a PWM signal 15 having a frequency fL less than the resonant frequency f0, going to LC circuit 16 having an output 57 with a magnitude as indicated by VC2 across capacitor 29 in FIG. 1. The duty cycle may be set to max with f increases to get big step voltage increases of VC2 to a voltage greater than 160 volts. The voltage may then be lowered with a big step frequency f decrease to less than 160 volts. Next, the voltage VC2 may be increased at mid steps with a smaller duty cycle at ¼ max for signal 15. Afterwards, the frequency may be increased or decreased in small steps to find a VC2 peak to locate the resonant frequency f0. The duty cycle of signal 15 may be increased to max to get greater than 195 volts at f0. A duty cycle may be changed to get 185 volts at VC2. This duty cycle may be kept as a flame duty since this is a duty cycle found for flame sensing. The VROD voltage may be measured with 64×2 A/D samples.

Portion 98 of FIG. 5 may be represented by a time line for the spark and flame sensing. The spark and flame sensing may alternate with the spark for 0.9 second and flame sensing for 0.1 second, at least until a flame is sensed. Portion 97 of FIG. 5 may continue from the time line for portion 98 and be represented by a time line for a spark and flame sense. After a positive flame sense, the sensing may be off for 0.4 second and on for 0.1 second. This sequence may continue until a flame is not detected. Then, a spark and flame sense sequence may reoccur.

Aspects of the present invention may be described in U.S. application Ser. No. 10/908,463, filed May 12, 2005; U.S. application Ser. No. 10/908,465, filed May 12, 2005; U.S. application Ser. No. 10/908,466, filed May 12, 2005; U.S. application Ser. No. 10/908,467, filed May 12, 2005; and U.S. application Ser. No. 11/276,129, filed Feb. 15, 2006; all of which are incorporated herein by reference.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A spark voltage and flame rod voltage generator for a combustion device, comprising:
a driver for receiving a low-voltage supply and a control signal;
an inductive-capacitive (LC) circuit connected to an output of the driver, for providing a flame rod voltage; and
a rectification-capacitive circuit connected to an output of the LC circuit for providing a spark voltage.

2. The generator of claim 1, wherein the low voltage supply has a magnitude less than magnitudes of the flame rod voltage and the spark voltage.

3. The generator of claim 1, wherein the frequency of the control signal can be changed to approach or equal a resonant frequency of the LC circuit.

4. The generator of claim 3, wherein:
a change in pulse width of the control signal can change the magnitudes of the flame rod voltage and the spark voltage; and
a change in frequency of the control signal can change the magnitudes of the flame rod voltage and the spark'voltage.

5. The generator of claim 1, further comprising:
a voltage sensing circuit connected to the output of the LC circuit;
a direct current (DC) blocker having a first end connected to the output of the LC circuit;
a flame rod connected to a second end of the DC blocker; and
a flame sensing circuit connected to the second end of the DC blocker.

6. The generator of claim 5, further comprising a controller having a first input connected to the voltage sensing circuit, a second input connected to the flame sensing circuit, and a first output for providing the control signal to the driver.

7. The generator of claim 6, further comprising a spark mechanism having a voltage input connected to an output of the rectification-capacitive circuit and a control input connected to a second output of the controller.

8. The generator of claim 7, further comprising:
a connection mechanism connected between the flame rod and the DC blocker; and
a compensation circuit, for reducing effects of an impedance of the connection mechanism upon the flame sensing circuit, having an input connected to the connection mechanism and an output connected to a third input of the controller.

9. The generator of claim 8, further comprising a current limiter connected in between the second end of the DC current blocker and the connection mechanism.

10. The generator of claim 9, wherein the controller has a third output for providing a bias voltage to the flame sensing circuit.

11. The generator of claim 9, wherein the first, second and third inputs of the controller are connected to analog-to-digital converters.

12. A method for generating a spark voltage and a flame rod voltage for a combustion device, from a low voltage supply of the combustion device, comprising:
providing an electrical supply having a first voltage to a driver circuit;
providing a pulse width modulation (PWM) signal having a duty cycle and a frequency to the driver circuit for driving an inductor-capacitor (LC) circuit with the PWM signal;
adjusting the pulse width and frequency of the PWM signal to obtain a near sinusoidal signal having a second voltage at an output of the LC circuit;
rectifying the near sinusoidal signal having the second voltage into a direct current (DC) signal; and
charging up a capacitor with the DC signal for a spark voltage.

13. The method of claim 12, further comprising:
lowering the second voltage of the near sinusoidal signal to a third voltage without effectively affecting the spark voltage on the capacitor; and
providing the near sinusoidal signal having the third voltage as a flame rod voltage; and
wherein each of the second and third voltages is greater than the first voltage.

14. The method of claim 13, further comprising:
providing the spark voltage to a spark mechanism for providing a spark in the combustion device when desired;
providing the near sinusoidal signal having the third voltage to a flame rod via a DC blocker; and
determining whether there is a flame via a voltage signal at the flame rod.

15. The method of claim 14, further comprising compensating the voltage signal at the flame rod.

16. A spark voltage and flame rod voltage generator for a combustion device, comprising:
an inductor-capacitor (LC) circuit;
a driver for driving the LC circuit with a pulse width modulated (PWM) signal;
a spark voltage circuit connected to an output of the LC circuit;
a voltage sensing circuit connected to the output of the LC circuit;
a flame sensing circuit connected via a direct current (DC) blocking device to the output of the LC circuit; and
a flame rod connected via the DC blocking device to the output of the LC circuit.

17. The generator of 16, wherein:
the generator uses a power supply having a first voltage;
the spark voltage circuit is for providing a second voltage;
the output of the LC circuit has a third output voltage; and
each of the second and third voltages is greater than the first voltage.

18. The generator of claim 16, wherein:
the PWM signal has a frequency which can be varied to nearly match a resonant frequency of the LC circuit so as to generate a near sinusoidal signal at the output of the LC circuit; and
the PWM signal has a duty cycle which can be varied to adjust an amplitude of the near sinusoidal signal.

19. The generator of claim 18, further comprising:
a voltage sensing circuit for detecting a voltage at the output of the LC circuit; and
wherein:
the spark voltage circuit comprises:
a storage device for holding a second voltage for a spark; and
a rectifier having a first end connected to the output of the LC circuit and having a second end connected to the storage device;
the frequency and/or duty cycle of the PWM signal can be adjusted to charge the storage device to the second voltage; and
the frequency and/or duty cycle of the PWM signal can be adjusted to reduce a third voltage at the output of the LC circuit to less than the second voltage; and
the frequency and/or duty cycle of the PWM signal can be adjusted as desired to change the third voltage for the flame rod.

20. The generator of claim 16, further comprising:
a controller having inputs connected to the voltage sensing circuit and the flame sensing circuit, and having an output for providing the PWM signal to the driver; and
a compensation circuit having a high impedance input connected to the flame rod and a low impedance output connected to the controller; and
wherein the compensation circuit comprises:
a voltage divider having a first end being the high impedance input, a second end connected to a reference voltage, and a terminal connected between the first and second ends of the voltage divider; and
a peak detector having an input connected to the terminal and having an output being the low impedance output.

* * * * *